(12) United States Patent
Choi et al.

(10) Patent No.: US 6,232,797 B1
(45) Date of Patent: May 15, 2001

(54) INTEGRATED CIRCUIT DEVICES HAVING DATA BUFFER CONTROL CIRCUITRY THEREIN THAT ACCOUNTS FOR CLOCK IRREGULARITIES

(75) Inventors: Won-jae Choi, Seoul; Jung-bae Lee; Si-yeol Lee, both of Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/378,099

(22) Filed: Aug. 20, 1999

(30) Foreign Application Priority Data

Sep. 1, 1998 (KR) .................................................. 98-35854

(51) Int. Cl.⁷ .................................................... H03K 19/00
(52) U.S. Cl. ................................. 326/93; 326/95; 326/113
(58) Field of Search ................................. 326/93, 95, 113, 326/56, 57, 58, 82, 83, 86; 365/196, 203, 208; 327/202

(56) References Cited

U.S. PATENT DOCUMENTS

| | | | |
|---|---|---|---|
| 4,777,623 | * 10/1988 | Simazu et al. | 365/189.05 |
| 4,974,241 | * 11/1990 | McClure et al. | 327/208 |
| 5,146,110 | * 9/1992 | Kim et al. | 365/189.08 |
| 5,280,203 | * 1/1994 | Hung et al. | 326/93 |

\* cited by examiner

*Primary Examiner*—Michael Tokar
*Assistant Examiner*—Steven S. Paik
(74) *Attorney, Agent, or Firm*—Myers Bigel Sibley & Sajovec

(57) ABSTRACT

Integrated circuit devices include a data buffer that is responsive to a control signal, enabled to pass data received at a data input thereof to a data output thereof when the control signal is in an active logic state and disabled to block passage of data from the data input to the data output when the control signal is in an inactive logic state. A data buffer control circuit is also provided. The data buffer control circuit latches a latency signal in response to a control clock, generates the control signal from the latched latency signal and comprises a pulse generator that drives the control signal to its inactive logic state in-sync with an edge of the latency signal. This inactive control signal can be used to disable the data buffer.

11 Claims, 5 Drawing Sheets

INTEGRATED CIRCUIT DEVICES HAVING DATA BUFFER CONTROL CIRCUITRY THEREIN THAT ACCOUNTS FOR CLOCK IRREGULARITIES

RELATED APPLICATION

This application is related to Korean Application No. 98-35854, filed Sep. 1, 1998, the disclosure of which is hereby incorporated herein by reference.

1. Field of the Invention

The present invention relates to integrated circuits, and more particularly to synchronous integrated circuit devices having data buffers therein and methods of operating same.

2. Background of the Invention

Synchronous dynamic random access memory devices (SDRAMs) typically convert an external clock signal (CLK) into an internal clock signal (PCLK) that is used to control operation of internal circuits. In addition, an SDRAM device may include control clock generators that generate specialized control clock signals in response to the external clock signal. For example, a buffered output control clock signal (CLKDQ) may be generated in response to the external clock signal and used internally to control the operation of a data output buffer.

Referring now to FIG. 1, a data output buffer 130 and output buffer control circuit 110 of a conventional SDRAM are illustrated. The output buffer control circuit 110 receives a data latency signal LAT and generates an output control signal PTRST. A CMOS transmission gate 111 and inverter 112 are utilized to pass the latency signal LAT under the control of a buffered output control clock signal (CLKDQ). In particular, when the buffered output control clock signal CLKDQ transitions to a logic 1 level, the latency signal LAT passes through the transmission gate 111 and becomes latched by a pair of inverters 113 and 114. An output inverter 115 is also provided.

The output control signal PTRST is provided as an input to the data output buffer 130 which comprises NAND gates 131 and 134, inverters 132, 133 and 135, NMOS pull-up transistor 136 and NMOS pull-down transistor 137. As will be understood by those skilled in the art, when the output control signal PTRST transitions to a logic 1 level, the data output buffer 130 becomes enabled and operates to pass a data on input/output signal line DIO to an output signal line DOUT. However, when the output control signal PTRST transitions to a logic 0 level, the data output buffer 130 becomes disabled and blocks passage of the data.

As described more fully hereinbelow with respect to FIGS. 2–3, the output control clock signal CLKDQ controls the timing of when the latency signal LAT is latched into the output buffer control circuit 110 and therefore controls the timing of when the data output buffer 130 is enabled to pass data or disabled to block data. For example, the timing diagram of FIG. 2 illustrates the generation of an internal clock signal PCLK in-sync with an external clock signal CLK and the generation of the output control clock signal CLKDQ in-sync with the external clock signal CLK. FIG. 2 also illustrates the generation of a latency signal LAT in response to the internal clock signal PCLK and the generation of the output control signal PTRST (and latching of the latency signal LAT) in response to the output control clock signal CLKDQ. Based on the configuration of the control circuit 110, Thus, a trailing edge of the latency signal LAT (that is in-sync with a rising edge of the internal clock signal PCLK) may be latched by the output buffer control circuit 110 (when the output control clock signal CLKDQ is at a logic 1 level) and passed to the data output buffer 130 as a disabling output control signal PTRST.

Because the timing paths associated with the generation of the internal clock signal PCLK and the output control clock signal CLKDQ may be different, the timing of the latency signal LAT may not correspond closely with the timing of the output control clock signal CLKDQ. Accordingly, as illustrated by FIG. 3, a faulty or attenuated external clock signal pulse (point a) may trigger a correct internal clock signal PCLK pulse, but may not trigger a correct output control clock signal CLKDQ pulse (point b). If this occurs, the output control signal PTRST may not transition at point "c" to a logic 0 level to thereby disable the data output buffer 130. In other words, the conventional SDRAM may be prone to malfunction in the event a faulty external clock signal is received by the SDRAM.

SUMMARY OF THE INVENTION

It is therefore an object of the present invention to provide circuits for controlling data buffers that can operate reliably even when clocking errors occur.

These and other objects, advantages and features of the present invention are provided by integrated circuit devices that may include a memory cell array and an output buffer that receives data from the memory cell array, via a data input/output signal line DIO. The output buffer passes the received data to a data output signal line DOUT under the control of an output control signal PTRST. The output control signal PTRST is generated by an output buffer control circuit. The output buffer control circuit comprises an output control signal generator and an automatic pulse generator. Both the output control signal generator and the automatic pulse generator are responsive to a latency signal LAT. The output control signal generator is also responsive to an output control clock CLKDQ and an automatic pulse signal PRECHDQ. The output control clock CLKDQ is generated by an output control clock generator and the latency signal LAT is generated by a latency signal generator. The latency signal generator is responsive to an internal clock generator that generates an internal clock PCLK. In addition, the output control clock generator and internal clock generator are responsive to an external clock signal CLK.

According to one aspect of the present invention, the output control clock CLKDQ and the internal clock signal PCLK and latency signal LAT derived therefrom are provided on separate timing paths. These different clock signal timing paths increase the likelihood that phase differences may occur between the internal clock signal PCLK and the output control clock CLKDQ. To inhibit the likelihood that a faulty external clock signal CLK will result in an inability to properly disable an output buffer, an automatic pulse generator is provided within the output buffer control circuit. The automatic pulse generator comprises a two-input NOR gate and an inverter chain that includes three inverters electrically connected in series. A trailing edge transition of the latency signal LAT (i.e., a 1→0 transition) will cause the NOR gate to generate a logic 1 pulse on the automatic pulse signal line PRECHDQ. The logic 1 pulse will also cause the control signal PTRST to be set to a logic 0 level, even if the output control clock is defective. This logic 0 output control signal PTRST will then operate to disable the output buffer in a proper manner.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 4:
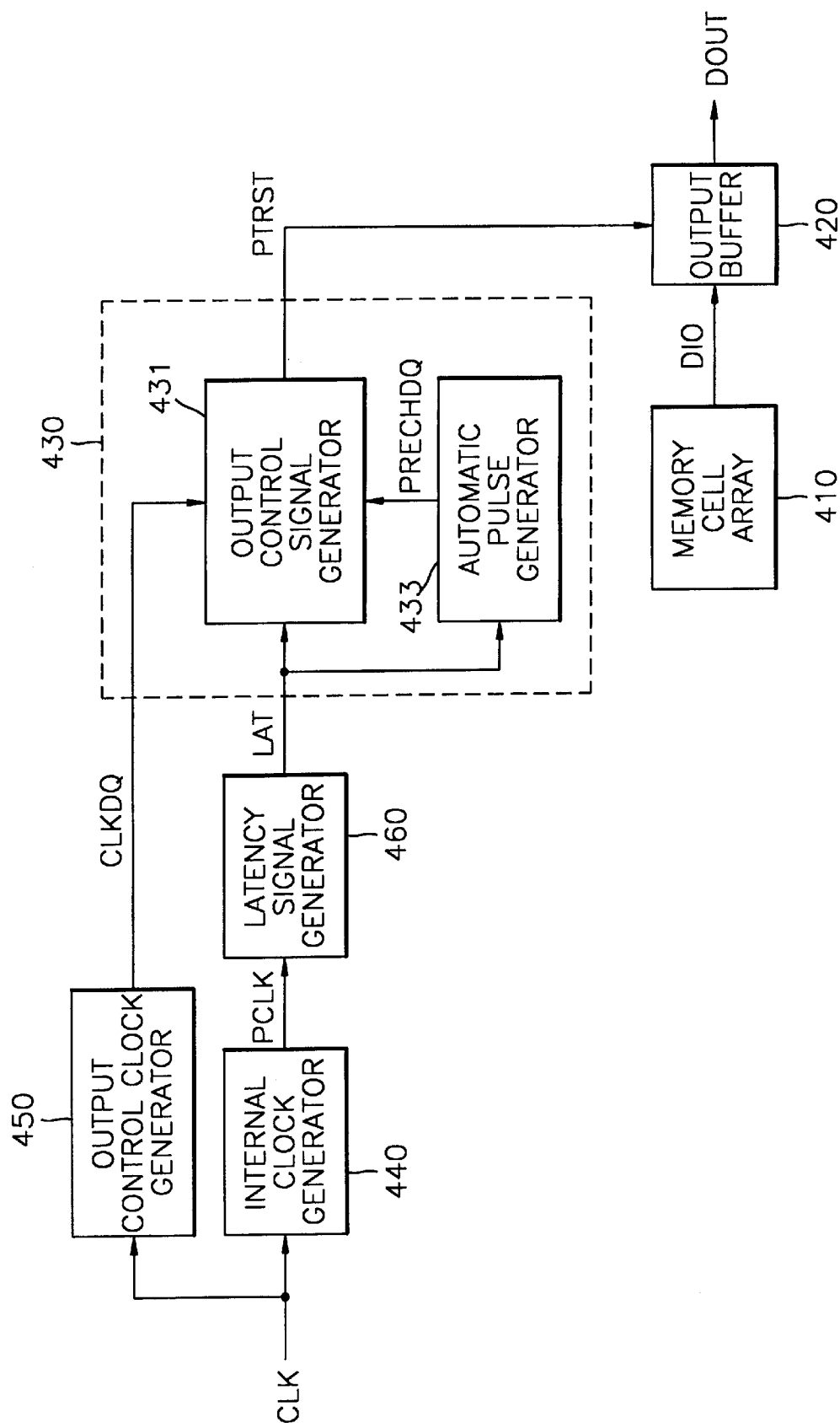
FIG. 4 is a block diagram of an integrated circuit memory device according to an embodiment of the present invention.
Figure 6:
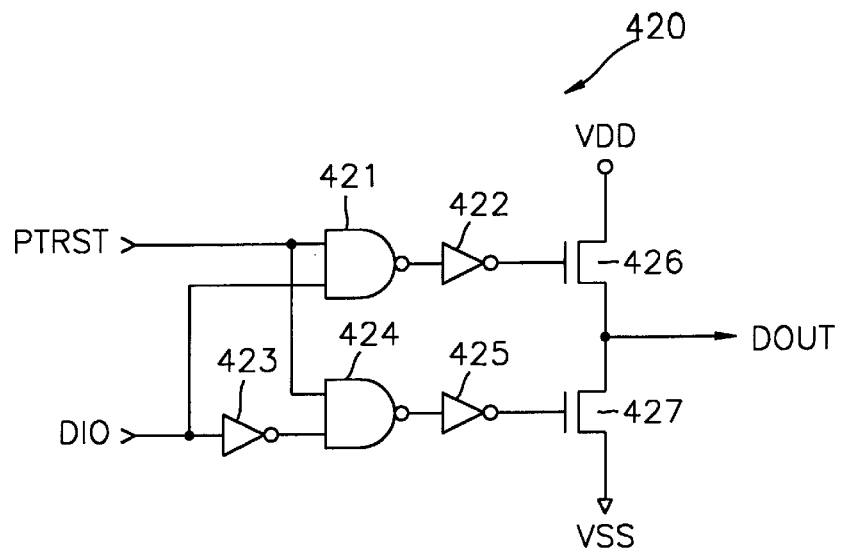
FIG. 6 is an electrical schematic of the output buffer of FIG. 4.

Referring now to FIG. 4, a block diagram of an integrated circuit memory device according to an embodiment of the present invention, is illustrated. The memory device comprises a memory cell array 410 and an output buffer 420 that receives data from the memory cell array 410, via a data input/output signal line DIO. The output buffer 420 passes the received data to a data output signal line DOUT under the control of an output control signal PTRST. As illustrated by FIG. 6, the output control signal PTRST is provided as an input to first and second NAND gates 421 and 424. These first and second NAND gates also receive data provided on the input/output signal line DIO. The output buffer 420 also includes inverters 422, 423 and 425, and NMOS transistors 426 and 427. The inverter 422 and NMOS transistor 426 may be replaced by a PMOS transistor (not shown).

The output control signal PTRST is generated by an output buffer control circuit 430. As illustrated, the output buffer control circuit 430 comprises an output control signal generator 431 and an automatic pulse generator 433. Both the output control signal generator 431 and the automatic pulse generator 433 are responsive to a latency signal LAT. The output control signal generator 431 is also responsive to an output control clock CLKDQ and an automatic pulse signal PRECHDQ. The output control clock CLKDQ is generated by an output control clock generator 450 and the latency signal LAT is generated by a latency signal generator 460. The latency signal generator 460 is responsive to an internal clock generator 440 that also generates an internal clock PCLK. In addition, the output control clock generator 450 and internal clock generator 440 are responsive to an external clock signal CLK.

Figure 1:
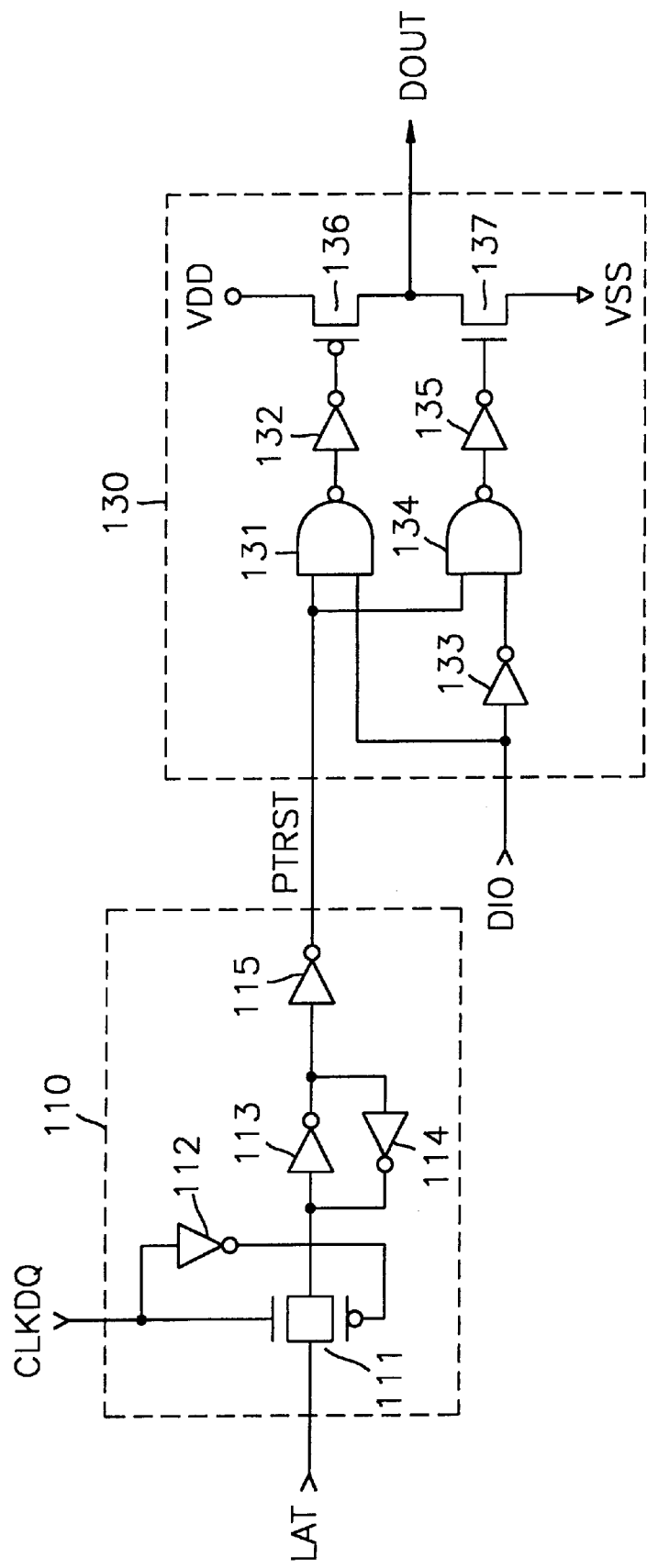
FIG. 1 is an electrical schematic of an output buffer and output buffer control circuit according to the prior art.
Figure 2:
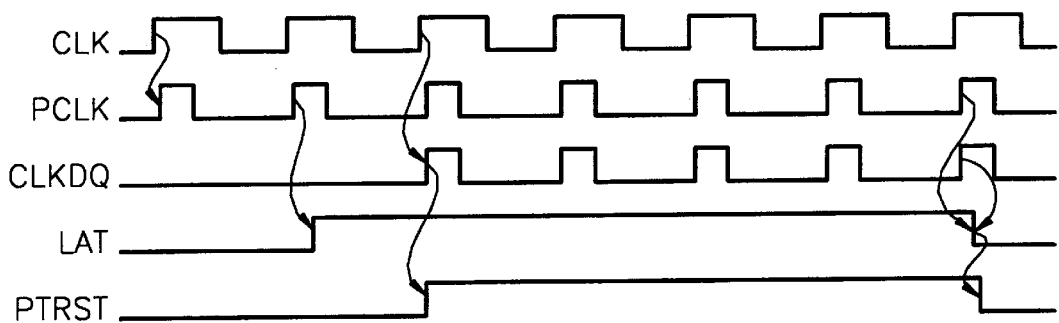
FIG. 2 is a timing diagram that illustrates operation of the devices of FIG. 1.
Figure 3:
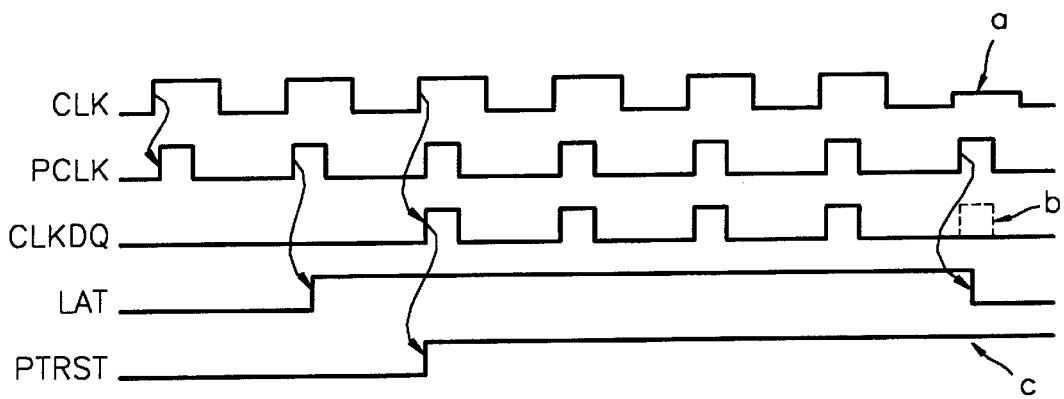
FIG. 3 is a timing diagram that illustrates operation of the devices of FIG. 1, in response to a faulty external clock signal.
Figure 7:
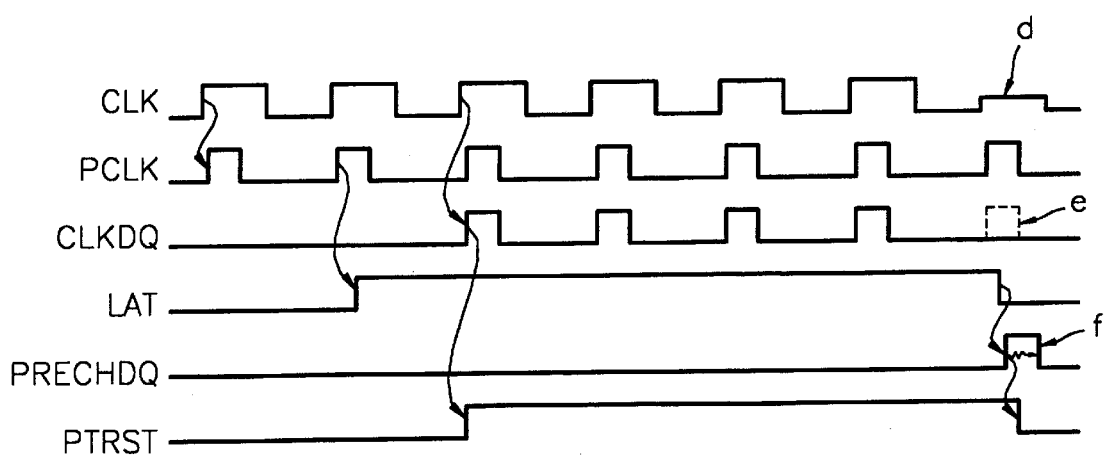
FIG. 7 is a timing diagram that illustrates operation of the memory device of FIG. 4.

As illustrated by FIG. 4, the output control clock CLKDQ and the internal clock signal PCLK and latency signal LAT derived therefrom are provided on separate timing paths. These different clock signal timing paths increase the likelihood that phase differences may occur between the internal clock signal PCLK and the output control clock CLKDQ. Moreover, as illustrated by FIG. 7 (which has some timing relationships in common with FIG. 3), a faulty external clock signal CLK pulse at point "d" may be detected by the internal clock generator 440 and result in the generation of a corresponding internal clock signal PCLK pulse, but may not be detected by the output control clock generator 450. Accordingly, as illustrated by FIG. 7, it is possible that one or more pulses within the output control clock CLKDQ may be omitted at the same time the latency signal LAT is undergoing a transition at the input of the output control signal generator 431. To inhibit the likelihood that a faulty external clock signal CLK will result in an inability to properly disable an output buffer, as described above with respect to FIGS. 1–3, an automatic pulse generator 433 is provided within the output buffer control circuit 430.

Figure 5:
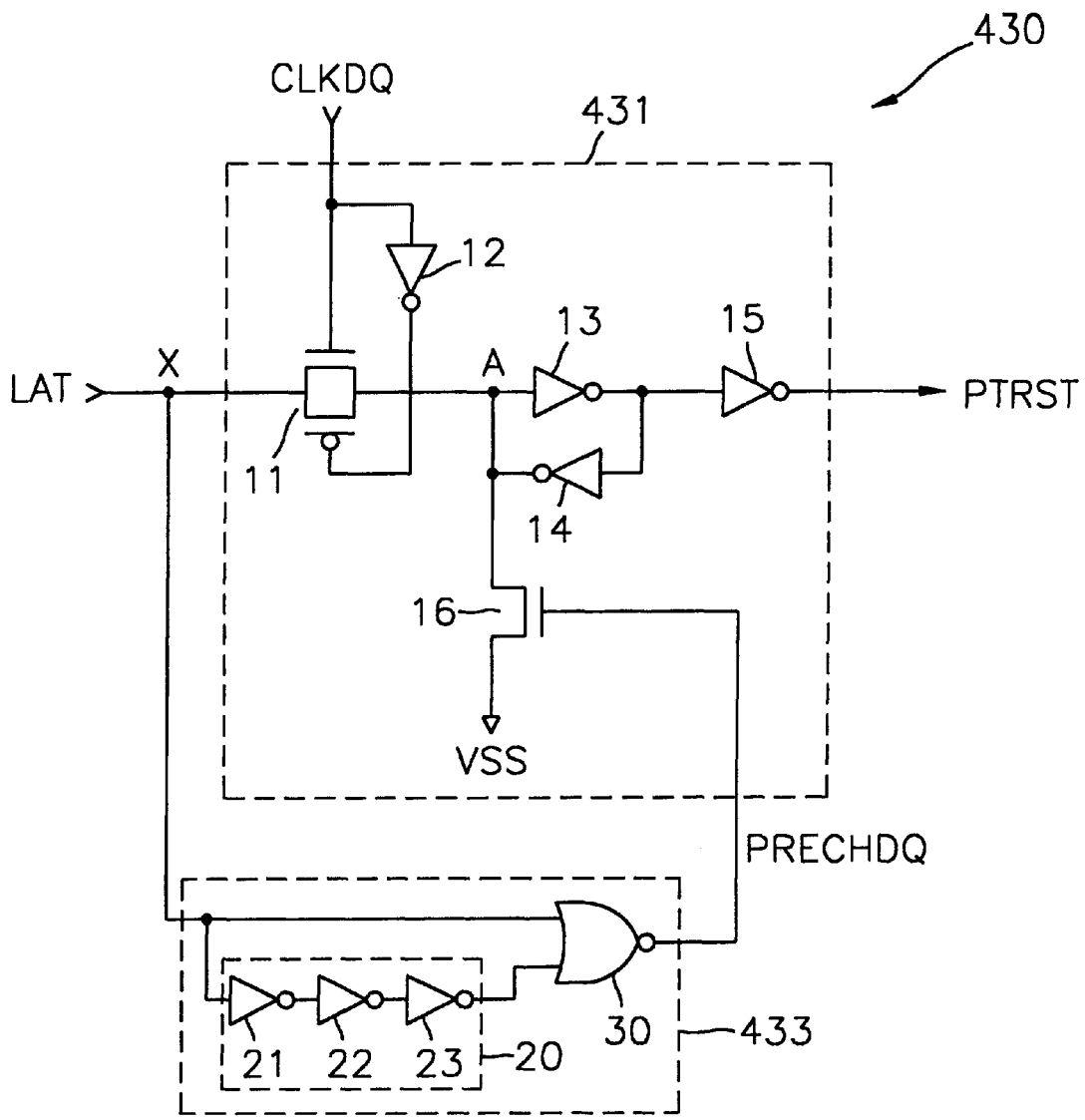
FIG. 5 is an electrical schematic of the output control signal generator of FIG. 4.

As illustrated by FIG. 5, the automatic pulse generator 433 comprises a two-input NOR gate 30 and an inverter chain 20 that includes three inverters 21–23 electrically connected in series. As will be understood by those skilled in the art, a trailing edge transition of the latency signal LAT (i.e., a 1→0 transition) will cause the NOR gate 30 to generate a logic 1 pulse on the automatic pulse signal line PRECHDQ. This pulse is illustrated at point "f" in FIG. 7 and the duration of this logic 1 pulse will be equivalent to the delay provided by the inverter chain 20. The logic 1 pulse will also cause the NMOS pull-down transistor 16 within the output control signal generator 431 to turn on and pull node A to a logic 0 level. Driving node A to a logic 0 level will cause the output of the latch formed by inverters 13 and 14 to latch at a logic 1 level and the output of inverter 15 to be set to a logic 0 level. Accordingly, irrespective of whether the output control signal generator 431 actually receives a correct output control clock CLKDQ, a trailing edge transition of the latency signal LAT will nonetheless result in the generation of a logic 0 output control signal PTRST. This logic 0 output control signal PTRST will then operate to disable the output buffer 420 in a proper manner. In other words, the output buffer 420 can be properly disabled even if an error occurs on the output control clock CLKDQ signal line, as illustrated by point "e" in FIG. 7, and even if the transmission gate 11 and inverter 12 within the output buffer control circuit 430 do not become operative to pass the latency signal LAT directly from node X to node A.

Accordingly, an integrated circuit device according to an embodiment of the present invention comprises a data buffer (e.g., output buffer 420) that is responsive to a control signal (PTRST), enabled to pass data received at a data input thereof to a data output thereof when the control signal is in an active logic state (e.g., logic 1) and disabled to block passage of data from the data input to the data output when the control signal is in an inactive logic state (e.g., logic 0). A preferred data buffer control circuit is also provided. This data buffer control circuit performs the functions of latching a latency signal (e.g., LAT) in response to a control clock (e.g., CLKDQ) and generating the control signal from the latched latency signal. According to a preferred aspect of the present invention, the data buffer control circuit also comprises a pulse generator that drives the control signal to its inactive logic state in-sync with a trailing edge of the latency signal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a data buffer that is responsive to a control signal, enabled to pass data received at a data input thereof to a data output thereof when the control signal is in an active logic state and disabled to block passage of data from the data input to the data output when the control signal is in an inactive logic state; and
   a data buffer control circuit that latches a latency signal in response to a control clock, generates the control signal from the latched latency signal and comprises a pulse generator that is responsive to the latency signal and drives the control signal to its inactive logic state in-sync with an edge of the latency signal.

2. The device of claim 1, wherein said data buffer control circuit comprises:
   a latch; and
   a pass transistor electrically coupled in series between an input of said latch and a reference signal line, and having a gate electrode electrically coupled to an output of the pulse generator.

3. The device of claim 2, wherein said data buffer control circuit further comprises a transmission gate having an input electrically coupled to an input of the pulse generator and an output electrically coupled to the input of said latch.

4. An integrated circuit device, comprising:
   a data buffer that is responsive to a control signal, enabled to pass data received at a data input thereof to a data output thereof when the control signal is in an active logic state and disabled to block passage of data from the data input to the data output when the control signal is in an inactive logic state; and
   a data buffer control circuit that latches a latency signal in response to a control clock, generates the control signal from the latched latency signal and comprises a pulse generator that drives the control signal to its inactive logic state in-sync with an edge of the latency signal, said pulse generator comprising:
      a multi-input NOR gate; and
      an inverter chain having an input electrically connected to a first input of said multi-input NOR gate and an output electrically connected to a second input of said multi-input NOR gate.

5. The device of claim 4, wherein said data buffer control circuit comprises:
   a latch:
      a pass transistor electrically coupled in series between an input of said latch and a reference signal line, and having a gate electrode electrically coupled to an output of said pulse generator: and
      a transmission gate having an input electrically coupled to an input of said pulse generator and an output electrically coupled to the input of said latch.

6. The device of claim 5, further comprising a latency signal generator having an output electrically connected to an input of said transmission gate and the first input of said multi-input NOR gate.

7. An integrated circuit device, comprising:
   a data buffer that is responsive to a control signal; and
   a data buffer control circuit that latches a first signal in response to a control clock, generates the control signal from the latched first signal and comprises a pulse generator that is responsive to the first signal and resets the control signal in-sync with an edge of the first signal.

8. The device of claim 7, wherein said data buffer control circuit comprises:
   a latch; and
   a pass transistor electrically coupled in series between an input of said latch and a reference signal line, and having a gate electrode electrically coupled to an output of the pulse generator.

9. The device of claim 8, wherein said data buffer control circuit further comprises a transmission gate having an input electrically coupled to an input of the pulse generator and an output electrically coupled to the input of said latch.

10. An integrated circuit device, comprising:
    a data buffer that is responsive to a control signal: and
    a data buffer control circuit that latches a first signal in response to a control clock, generates the control signal from the latched first signal and comprises a pulse generator that resets the control signal in-sync with an edge of the first signal, said pulse generator comprising:
       a multi-input NOR gate; and
       an inverter chain having an input electrically connected to a first input of said multi-input NOR gate and an output electrically connected to a second input of said multi-input NOR gate.

11. The device of claim 9, wherein the pulse generator comprises:
    a multi-input NOR gate; and
    an inverter chain having an input electrically connected to a first input of said multi-input NOR gate and an output electrically connected to a second input of said multi-input NOR gate.

* * * * *